United States Patent
Holcroft et al.

(10) Patent No.: US 7,210,063 B2
(45) Date of Patent: Apr. 24, 2007

(54) PROGRAMMABLE DEVICE AND METHOD OF PROGRAMMING

(75) Inventors: John S. T. Holcroft, Woking (GB); Christopher J. Lane, Reading (GB); Ross A. Oldfield, Reading (GB)

(73) Assignee: LSI Logic Corporation, Milpitas, CA (US)

( * ) Notice: Subject to any disclaimer, the term of this patent is extended or adjusted under 35 U.S.C. 154(b) by 597 days.

(21) Appl. No.: 10/228,390

(22) Filed: Aug. 27, 2002

(65) Prior Publication Data

US 2004/0044927 A1 Mar. 4, 2004

(51) Int. Cl.
*G06F 11/00* (2006.01)
(52) U.S. Cl. .............. 714/27; 714/31; 714/38; 714/42; 714/43; 711/103
(58) Field of Classification Search .............. 714/31, 714/38, 42, 43, 27; 711/103
See application file for complete search history.

(56) References Cited

U.S. PATENT DOCUMENTS

| | | | |
|---|---|---|---|
| 5,925,140 A * | 7/1999 | Hudson | 714/52 |
| 6,266,736 B1 * | 7/2001 | Atkinson et al. | 711/103 |
| 6,438,666 B2 * | 8/2002 | Cassagnol et al. | 711/163 |
| 6,636,992 B1 * | 10/2003 | Yuan et al. | 714/52 |
| 6,711,684 B1 * | 3/2004 | Moroney et al. | 713/191 |
| 6,732,301 B1 * | 5/2004 | Landry et al. | 714/43 |
| 6,851,013 B1 * | 2/2005 | Larsen et al. | 711/103 |
| 6,864,710 B1 * | 3/2005 | Lacey et al. | 326/39 |

* cited by examiner

*Primary Examiner*—Robert W. Beausoliel
*Assistant Examiner*—Emerson Puente
(74) *Attorney, Agent, or Firm*—Christopher P. Maiorane PC

(57) ABSTRACT

The invention may relate to a method of programming a programmable non-volatile device. The programmable non-volatile device may be programmed while coupled to a circuit in which the programmable non-volatile device is to be used. The method may include establishing a connection and communicating information. The connection may be established from an external device to a test interface of the circuit. The information may be communicated from the external device through the test interface, for programming the programmable non-volatile device.

20 Claims, 4 Drawing Sheets

PROGRAMMABLE DEVICE AND METHOD OF PROGRAMMING

FIELD OF THE INVENTION

The present invention may relate to programming of a programmable device while in-circuit on a circuit board. For example, the programmable device may be an electrically programmable non-volatile memory (such as an electrically erasable programmable read only memory (EEPROM), or a FLASH memory), or a programmable logic device (PLD) (such as a field programmable gate array (FPGA)).

BACKGROUND TO THE INVENTION

In many electrical and electronic products, control software and/or control data is provided in an electrically programmable non-volatile memory, of which a FLASH memory (also called FLASH ROM) is typical. For example, the product may be a set-top box. During development or modification of the product, the FLASH memory often needs to be programmed or reprogrammed. During manufacture, the FLASH memory may need to be programmed once the FLASH memory is in the product. When the product is used in the field, the FLASH memory may also need to be reprogrammed with updated contents.

Sockets can be provided on a circuit board to enable the FLASH memory to be removed for programming or reprogramming. However, such sockets represent additional cost and size, and may also be a source of potential unreliability. A memory chip is also vulnerable to damage when being inserted in, and removed from a socket. A modern FLASH memory device is generally a surface mount device that is very fragile and can easily be damaged by insertion into and removal from a socket. Soldering the FLASH memory to a circuit board provides cost savings, a smaller size, and greater reliability. However, in order to facilitate reprogramming of a soldered-in FLASH memory, a small memory programming application program can be stored in a protected portion of the FLASH memory that cannot be erased. The resident application program can then be executed to program the rest of the FLASH memory. A main disadvantage is that the resident programming application permanently occupies a portion of the available memory, and thereby limits the amount of free memory available for the intended product software. Another disadvantage is a lack of flexibility because the software to be programmed into the FLASH memory has to be made in a way that is compatible with the resident programming application. Difficulties commonly arise updating the resident programming application itself, because the programming application has to be executed to load software into the FLASH memory. A further disadvantage is the work to pre-program the FLASH memory with the resident programming application before the FLASH memory can be installed on the circuit board.

SUMMARY OF THE INVENTION

The invention may relate to a method of programming a programmable non-volatile device. The programmable non-volatile device may be programmed while coupled to a circuit in which the programmable non-volatile device is to be used. The method may include establishing a connection and communicating information. The connection may be established from an external device to a test interface of the circuit. The information may be communicated from the external device through the test interface, for programming the programmable non-volatile device.

Features, objects and advantages of the invention include: (i) enabling a programmable device to be programmed in-circuit without requiring a resident programming application in the device to be programmed; (ii) avoiding programming limitations of conventional soldered-in programmable devices; and/or (iii) avoiding the cost, size, reliability and potential damage problems associated with socket-mounted devices. Further features, objects and advantages of the invention will become apparent from the following description, claims and drawings.

BRIEF DESCRIPTION OF THE DRAWINGS

Non-limiting embodiments of the invention are now described by way of example only, with reference to the appended claims and accompanying drawings, in which:

DETAILED DESCRIPTION OF A PREFERRED EMBODIMENT

Figure 1:
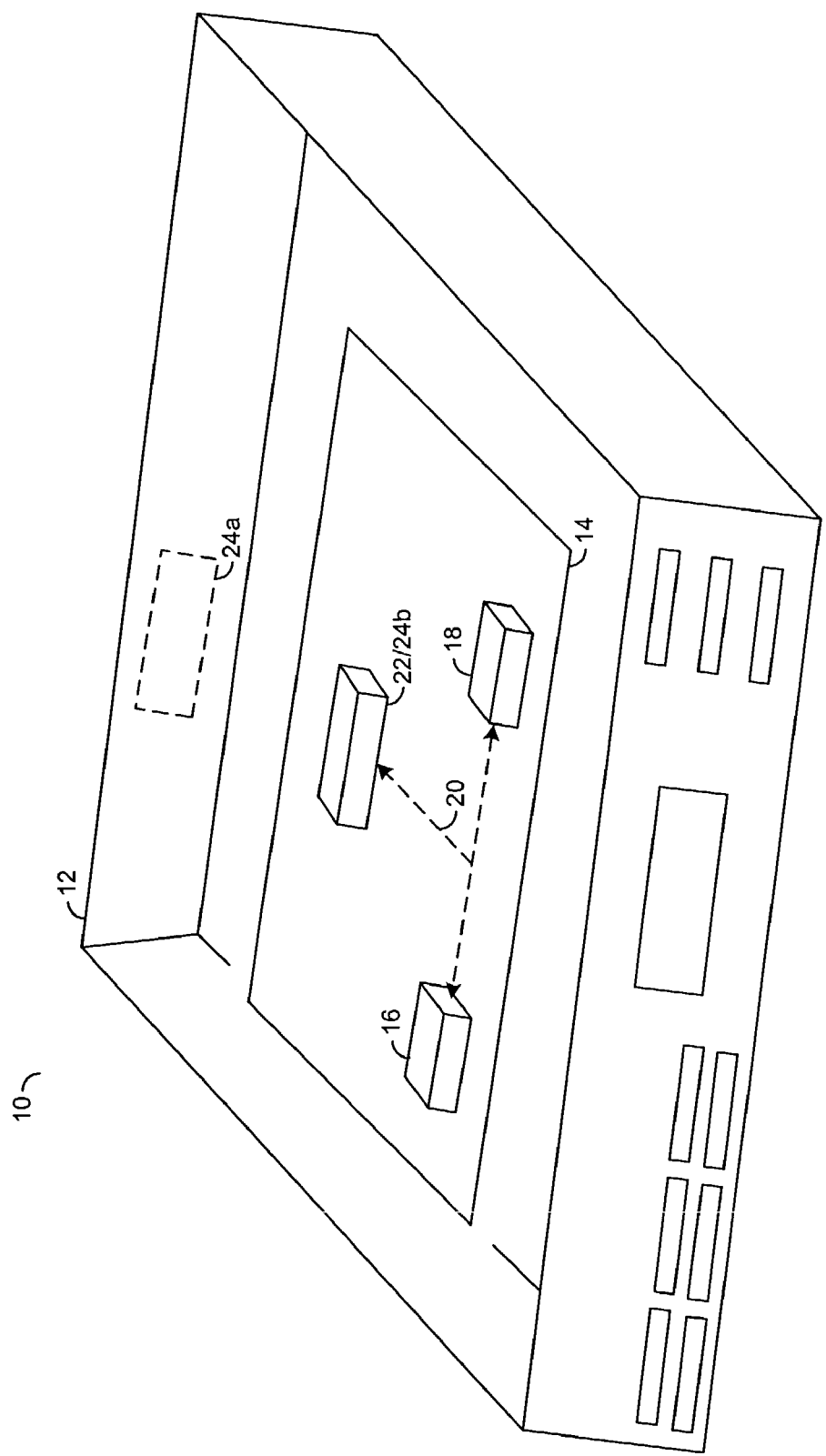
FIG. 1 is a schematic illustration of a set-top box.

Referring to FIG. 1, an electronic product in the form of a set-top box 10 may generally comprise a case 12 containing at least one circuit board 14. The circuit board 14 may carry a plurality of electronic devices including, for example, a processor 16, and a programmable non-volatile device 18. The programmable non-volatile device 18 may, for example, be a memory or a PLD. The programmable non-volatile device 18 may be an EEPROM, for example, a FLASH memory. In the case of a memory, the memory may be intended to contain control software and/or control data, for example, for controlling operation of the set-top box 10 when in normal use. The programmable non-volatile device 18 may be permanently secured to the circuit board 14, for example, by being soldered to the circuit board 14. Permanently securing the programmable non-volatile device 18 may avoid the additional cost, size and reliability problems of using a socket to allow the device 18 to be removable from the circuit board. Permanently securing the programmable non-volatile device 18 may also avoid risking physical and electrical damage to the device 18 caused by removal from, and insertion in, a socket. The programmable non-volatile device 18 may, for example, be a surface-mount integrated circuit. Surface-mount components may be fragile and therefore not well suited to withstanding the forces experienced during removal from, and insertion in, a socket. The circuit board 14 may carry other electronic devices and components (not shown). The processor 16 may communicate with the programmable non-volatile device 18, and with other devices, via a communications bus 20. The communications bus 20 may include one or more control lines, one or more data lines, and/or one or more address lines.

The circuit board may also carry a test interface 22. The test interface 22 may be coupled to the bus 20. The test interface 22 may be configured to take control of the bus 20 when the test interface 22 is active, thereby overriding bus control which may normally reside with one or more other devices, for example, the processor 16. The test interface 22 may include a connector terminal 24a/b. The connector terminal may be accessible as an external connector 24a on the case 12, or as an internal connector 24b on the circuit board 14 accessible once the case 12 has been opened. The test interface 22 may be operable to simulate bus accesses to and from devices on the circuit board 14. For example, the test interface 22 may be a EJTAG interface. The EJTAG interface may be defined by an EJTAG specification, document number MD00047, published by MIPS Technologies, Inc., Mountain View, Calif., and hereby incorporated by reference in its entirety.

Figure 2:
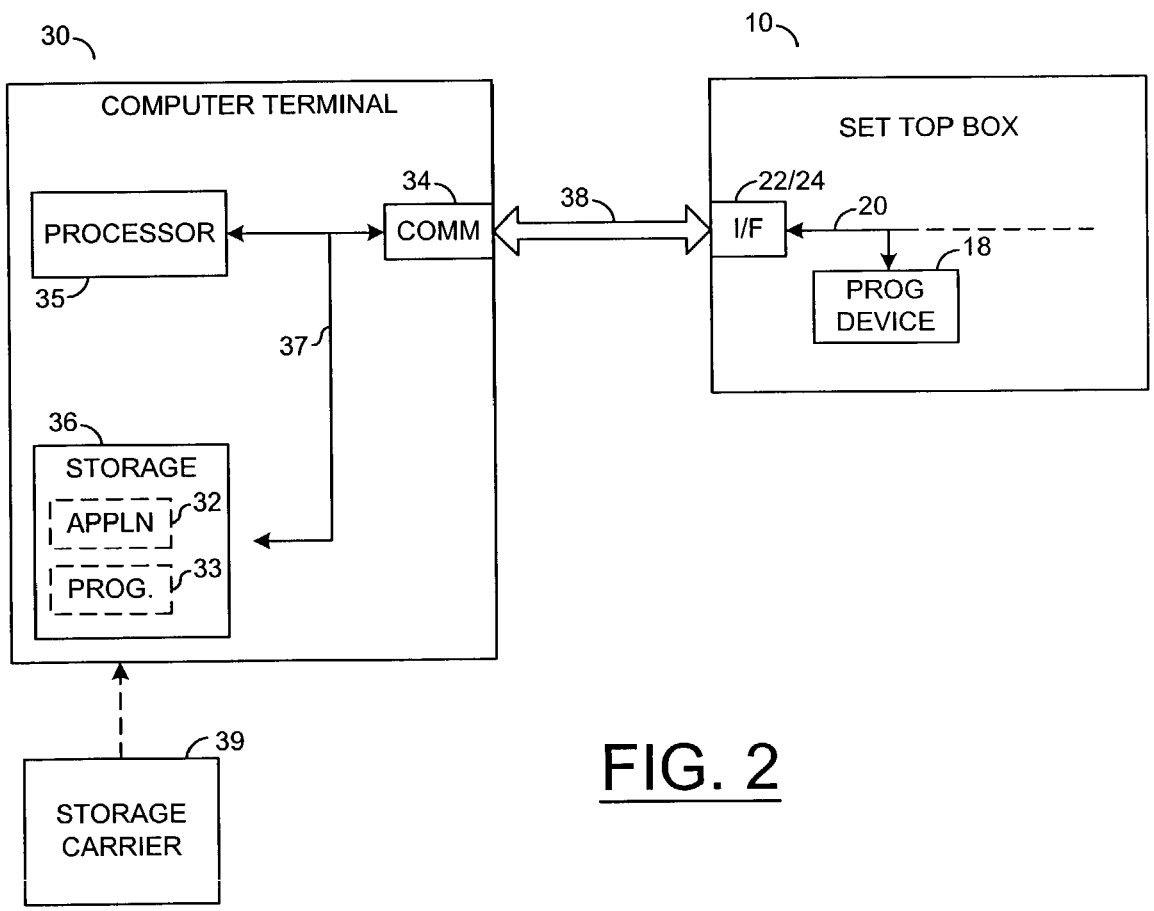
FIG. 2 is a schematic illustration showing programming of the set-top box by an external computer terminal.

FIG. 2 illustrates an example of how an external computer terminal 30 may be coupled to the product 10. The computer terminal 30 may be referred to as being external and not forming part of the product 10 or the internal circuitry of the product 10. The computer terminal 30 may be a stand-alone computer (for example, a personal computer) or a workstation coupled to a network (for example, a UNIX workstation). The computer terminal 30 may generally include a communications device 34, a processor 35 and a storage device 36 interconnected by an internal bus 37. The communications device 34 may be coupleable to the test interface 22 via a link 38 to the connector terminal 24. The storage device 36 may include plural devices (not shown), and may be formed of one or more of, for example, volatile memory, non-volatile memory, magnetic media and optical media. The computer terminal 30 may execute interface application software 32 for activating and communicating with the test interface 22. The interface application software 32 may write command signals from the computer terminal 30 to the communications bus 20, and/or read data back from the bus 20 to the computer terminal 30. For example, the computer terminal 30 may execute an EJTAG interface command application 32.

An advantageous feature of this embodiment may be the use of the computer terminal 30 coupled via the test interface 22 to program the programmable non-volatile device 18. The programming contents 33 may be stored in the computer terminal 30, for example, in the storage device 36, or in a peripheral connected to the computer terminal 30. For example, if the programmable non-volatile device 18 is a memory, then software and/or data may be programmed into the memory. If the programmable non-volatile device 18 is a PLD, then configuration data may be programmed into the PLD. The computer terminal 30 may communicate bus commands to the bus 20 via the test interface 22 to load the programming contents 33 into the product 10, for example, to one of more devices coupled to the bus 20. The bus commands may directly address the programmable non-volatile device 18 via the bus 20. The bus commands may directly load programming contents into the programmable non-volatile device via the bus 20. The entire contents of the programmable non-volatile device 18 may be programmed, or configured, from the data sent from computer terminal 30.

Figure 4:
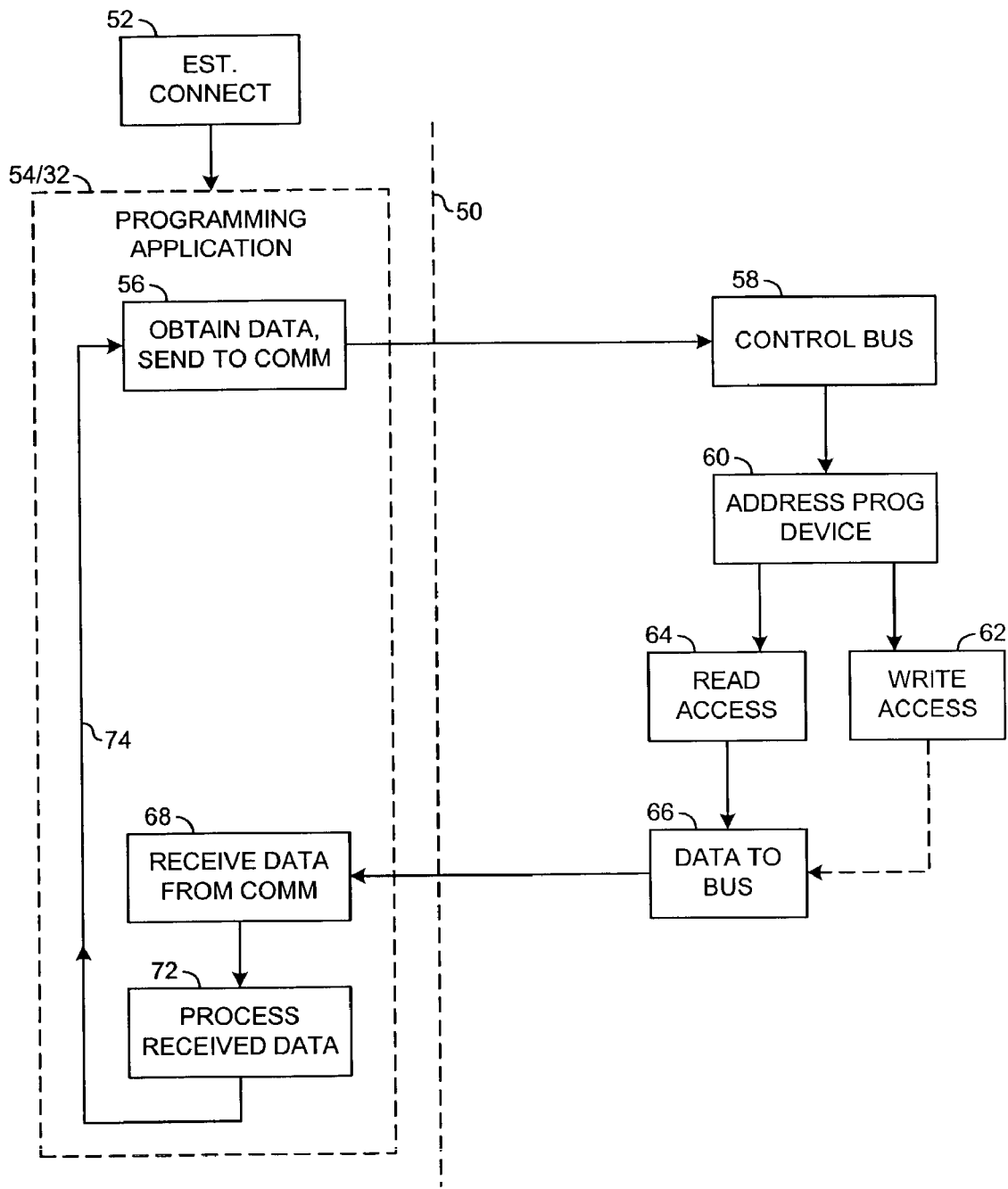
FIG. 4 is a flow diagram illustrating an example programming by the computer terminal.

FIG. 4 may depict schematically general method steps for programming the programmable device 18 using the computer terminal 30. In FIG. 4, method steps to the left of broken line 50 may be performed externally of the set-top box 10, for example, using the computer terminal 30, and steps to the right of the broken line 50 may be performed within the set-top box 10. The method may include a step 52 of establishing a connection, for example, via the link 38, between the communication device 34 of the computer terminal 30 and the connector terminal 24 of the test interface 22. The method may further include a step 54 of executing the application program 32 on the computer terminal 30. The application program 32 may control communication between the computer terminal 30 and the test interface 22. The application program 32 may instruct a plurality of accesses to the programmable non-volatile device 18, via the test interface 22 and the bus 20, for programming the device 18. At step 56, an access may be instructed from the application program 32 to the test interface 22. At step 58, corresponding command signals may be generated on the bus 20 by the test interface 22. At step 60, the command signals on the bus 20 may address the programmable non-volatile device 18. The access may be a read access 64 for reading information from the programmable non-volatile device 18 to the bus 20 (step 66), and then to the computer terminal 30 via the test interface 22 (step 68). The access may be a write access 62 for writing information (supplied initially from the computer terminal 30) from the bus 20 to the programmable non-volatile device 18. A write access 62 may terminate without any information being returned to the computer terminal 30 or, as depicted by broken line 70, a write confirmation signal may be returned to the computer terminal 30 via the bus 20 and the test interface 22. The application program 32 may also include one or more processing steps 72 for processing information and/or making decisions based on processed information. As indicated by line 74, the application program may return to step 56, to obtain next information to be sent to the programmable non-volatile device 18 via the test interface 22. The application program 32 may include the information 33 for programming the programmable non-volatile device 18, or the information 33 may be external to the application program 32. The application program 32 and/or the information 33 for programming the programmable non-volatile device 18 may reside on a machine-readable information carrier 39 (FIG. 2) (a computer program product) which may form part of, and/or be readable by, the storage device 36.

Figure 3:
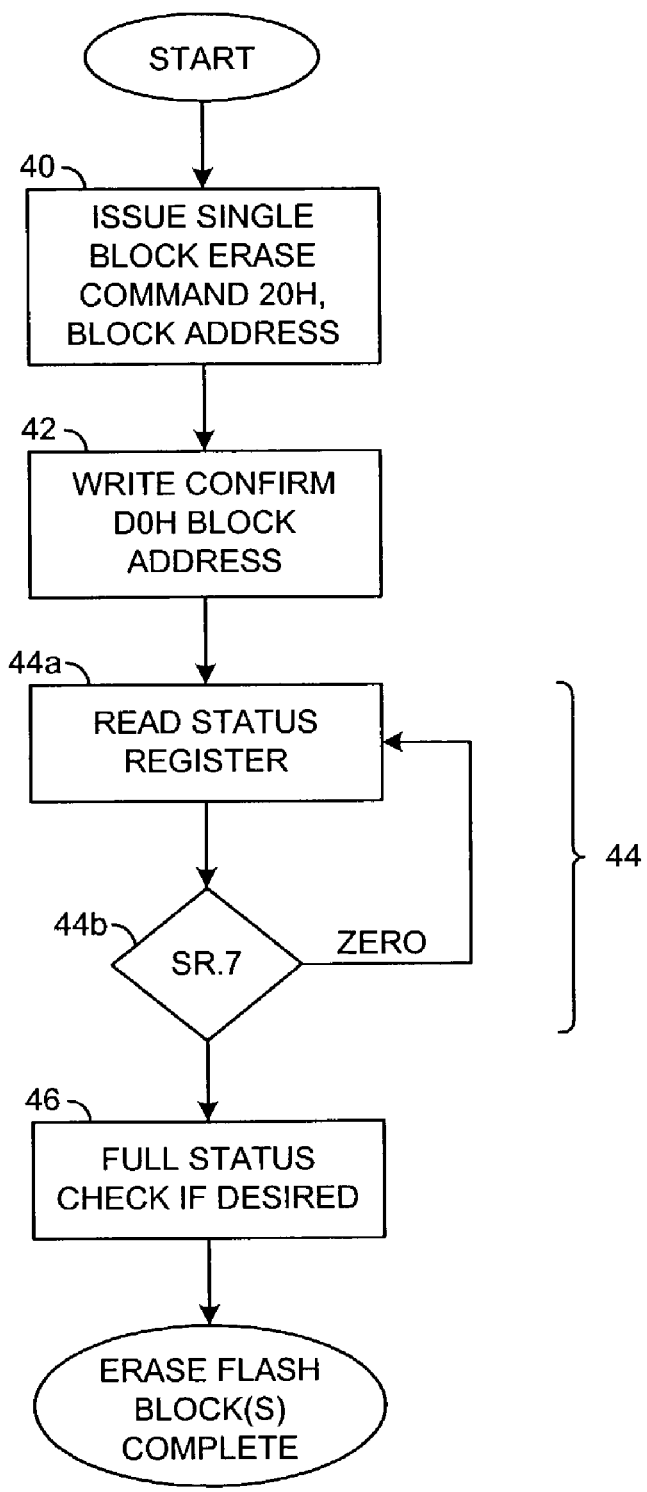
FIG. 3 is a flow diagram illustrating an example block erase routine executed from the computer terminal.

By way of example, FIG. 3 illustrates the execution steps for a block erase command for an Intel FLASH memory. The execution steps may be executed from the computer terminal 30 via the test interface 22 and the bus 20. A first step 40 may comprise instructing a block erase by writing, via the test interface 22 and the bus 20, a predetermined first value, for example 20H (hexadecimal), to a block address in the FLASH memory. A second step 42 may comprise confirming the block erase instruction by writing, via the test interface 22 and the bus 20, a predetermined second value, for example D0H (hexadecimal), to the block address. A third step 44 may comprise repeatedly reading from a certain register until a predetermined condition may be detected. For example, the predetermined condition may be that a seventh bit of the status register value becomes zero. The third step 44 may be represented by a first sub-step 44a of reading the register to the bus 20, and then via the test interface 22 to the computer terminal 30. Within the computer terminal 30, a second sub-step 44b may be performed of checking whether the predetermined condition may be satisfied, for example, whether or not bit seven of the read data may be zero. If the predetermined condition is not satisfied (for example, bit seven equals not yet zero), then the execution may loop back to step 44a. If the predetermined condition is satisfied (for example, bit seven equals zero), then the block erase command may be completed. A further optional verification step 46 may be carried out to check the status of the block erase.

FIG. 3 generally shows that instructing a certain programming command may involve execution of plural steps to actually execute the instructed command for the programmable non-volatile device 18. By using an external computer terminal 30 coupled to the test interface 22, the plural steps may be executed without requiring a dedicated programming application to be permanently resident in the product 10, for example, in the programmable non-volatile device 18. The steps may be executed directly by the computer terminal 30 which may be able to address electronic devices coupled to the bus 20 as if the programming application were being executed by the processor 16. Programming the programmable non-volatile device 18 through the test interface 22 may therefore avoid the inconveniences of a permanently resident programming application in the programmable non-volatile device 18. In particular, for a memory, the memory space may be used more efficiently, and more memory space may be made available for the downloaded software and/or data for the product 10. For example, the entire memory space of the memory may be overwritten by the programming. Also, the technique of the present embodiment may avoid the need to pre-program a resident programming application into the memory 18 before the memory may be fitted to the circuit board 14.

Although the above description has focussed on a programmable non-volatile device 18 in the form of a memory, the same principles may be applied to program any type of programmable non-volatile device, for example, a PLD such as a FPGA.

It may be appreciated that the foregoing description may be merely illustrative of a preferred form of the invention, and that many modifications, developments and equivalents may be used without departing from the scope and/or principles of the invention.

The invention claimed is:

1. A method of programming a programmable non-volatile device while coupled to a circuit in which said programmable non-volatile device is to be used, said method comprising the steps of:
   (A) establishing a connection from an external device to a test interface device of said circuit;
   (B) changing control of a bus of said circuit from (i) a processor of said circuit to (ii) said test interface device, said bus directly connecting said test interface device, said programmable non-volatile device and said processor;
   (C) communicating a plurality of accesses from said external device to said test interface device; and
   (D) generating from said test interface device (i) while in control of said bus, (ii) directly to said programmable non-volatile device and (iii) independent of said processor, a plurality of commands on said bus corresponding to said accesses that program said programmable non-volatile device, wherein prior to step (D) and after step (A), said programmable non-volatile device comprises a non-erasable portion containing no pre-programmed information.

2. The method according to claim 1, wherein said programmable non-volatile device is permanently coupled to said circuit.

3. The method according to claim 1, wherein step (D) comprises the sub-step of:
   programming an entire programmed content of said programmable non-volatile device with information from said external device.

4. The method according to claim 1, wherein step (C) comprises the sub-step of:
   executing an application program on said external device for issuing said accesses to said test interface device, wherein said application program resides in a storage carrier readable by a storage device of said external circuit.

5. The method according to claim 1, wherein at least one of said plurality of commands generated by said test interface device is a write command recognizable by said programmable non-volatile device on said bus.

6. The method according to claim 1, wherein at least one of said plurality of accesses received by said test interface device is a read access.

7. The method according to claim 1, wherein said programmable non-volatile device comprises a memory.

8. The method according to claim 7, wherein said programmable non-volatile device is an electrically erasable programmable read-only memory.

9. The method according to claim 8, wherein said programmable non-volatile device is a FLASH memory.

10. The method according to claim 1, wherein said test interface device is an EJTAG interface compatible device.

11. The method according to claim 1, wherein said circuit is a set-top box circuit.

12. The method according to claim 1, wherein said programmable non-volatile device comprises a programmable logic device.

13. An apparatus comprising:
    a circuit having (i) a first processor, (ii) a programmable non-volatile device, (iii) a test interface device and (iv) a bus directly connecting said first processor, said programmable non-volatile device and said test interface device,
    wherein said test interface device is configured to (A) change control of said bus from (i) said first processor to (ii) said test interface device and (B) generate (i) while in control of said bus, (ii) directly to said programmable non-volatile device and (iii) independently of said first processor, a plurality of commands on said bus corresponding to a plurality of accesses that program said programmable non-volatile device; and
    a programming device (A) external to said circuit, (B) coupleable to said test interface device of said circuit, (C) configured to establish a connection to said test interface device and (D) configured to communicate said accesses to said test interface device, wherein prior to programming said programmable non-volatile device and after establishing said connection, said programmable non-volatile device comprises a non-erasable portion containing no pre-programmed information.

14. The apparatus according to claim 13, wherein said programming device further comprises a second processor for executing an application program.

15. The apparatus according to claim 13, wherein said programming device further comprises a second processor for executing an application program to communicate data to said programmable non-volatile device, via said test interface device and said bus, independent of said first processor.

16. The apparatus according to claim 13, wherein said programmable non-volatile device is programmed for controlling an operation of said circuit.

17. The apparatus according to claim 13, wherein said programming device is an EJTAG interface compatible device.

18. A machine readable computer program product carrying instructions for controlling a computer to program a programmable non-volatile device while the programmable non-volatile device is coupled in a circuit in which the programmable non-volatile device is to be used, said machine readable computer program product comprising the steps of:

(A) establishing a connection from said computer to a test interface device of said circuit;

(B) activating said test interface device to change control of a bus of said circuit from (i) a processor of said circuit to (ii) said test interface device, said bus directly connecting said test interface device, said programmable non-volatile device and said processor; and (C) communicating a plurality of accesses from said computer to said test interface device such that said test interface device generates (i) while in control of said bus, (ii) directly to said programmable non-volatile device and (iii) independent of said processor, a plurality of commands on said bus corresponding to said accesses that program said programmable non-volatile device, wherein prior to programming said programmable non-volatile device and after establishing said connection, said programmable non-volatile device comprises a non-erasable portion containing no pre-programmed information.

19. A method of programming a programmable non-volatile device while coupled to a circuit in which said programmable non-volatile device is to be used, said method comprising the steps of:

(A) establishing a connection from an external device to a test interface device of said circuit;

(B) changing control of a bus of said circuit from (i) a processor of said circuit to (ii) said test interface device, said bus directly connecting said test interface device, said programmable non-volatile device and said processor;

(C) communicating a plurality of accesses from said external device to said test interface device by executing an application program on said external device for issuing said accesses to said test interface device, wherein (i) said application program resides in a storage carrier readable by a storage device of said external circuit and (ii) at least one of said plurality of accesses received by said test interface device is a read access;

(D) generating from said test interface device (i) while in control of said bus, (ii) directly to said programmable non-volatile device and (iii) independent of said processor, a plurality of commands on said bus corresponding to said accesses that program said programmable non-volatile device; and (E) transferring a write confirmation signal from said programmable non-volatile device through both said bus and said test interface device to said external device to confirm a successful write operation in said programmable non-volatile device.

20. The method according to claim 19, wherein prior to step (D) and after step (A), said programmable non-volatile device comprises a non-erasable portion containing no pre-programmed information.

* * * * *